(12) United States Patent
Groiβ

(10) Patent No.: US 7,463,077 B2
(45) Date of Patent: Dec. 9, 2008

(54) DEVICE FOR GENERATING A PERIODIC CLOCK SIGNAL

(75) Inventor: Stefan Hermann Groiβ, Villach-Landskron (AT)

(73) Assignee: Infineon Technologies AG, Munich (DE)

( * ) Notice: Subject to any disclaimer, the term of this patent is extended or adjusted under 35 U.S.C. 154(b) by 65 days.

(21) Appl. No.: 11/557,777

(22) Filed: Nov. 8, 2006

(65) Prior Publication Data

US 2008/0111640 A1 May 15, 2008

(30) Foreign Application Priority Data

Oct. 25, 2006 (DE) ........................ 10 2006 050 375

(51) Int. Cl.
*G06F 1/04* (2006.01)
*H03K 3/00* (2006.01)
*H04L 7/00* (2006.01)

(52) U.S. Cl. ....................... 327/299; 375/354

(58) Field of Classification Search ................. 327/291, 327/299, 304; 331/74–77; 375/354
See application file for complete search history.

(56) References Cited

U.S. PATENT DOCUMENTS 5,396,217 A * 3/1995 Proefke et al. ......... 340/426.26
5,426,392 A   6/1995 Kornfeld
5,754,356 A   5/1998 Honjo et al.

FOREIGN PATENT DOCUMENTS

JP      59146216 A  *  8/1984

\* cited by examiner

*Primary Examiner*—David Mis
(74) *Attorney, Agent, or Firm*—Dicke, Billig & Czaja, PLLC

(57) ABSTRACT

A device for generating a periodic clock signal according to the invention comprises a bandpass filter is disclosed. In one embodiment, the bandpass filter includes a bandpass filter input for receiving an input signal and a bandpass filter output for outputting a bandpass filter signal. The device includes further a comparator. A comparator has at least one comparator input receiving the bandpass filtered signal and a comparator output for outputting the clock signal. The comparator is adapted to output a first signal level at the comparator output, if the bandpass filtered signal exceeds a reference level. A zero crossing of the bandpass filtered signal may be used as reference level. A second signal level is output at the comparator output if the bandpass filter signal falls below the reference level. The output signal of the comparator is the clock signal.

17 Claims, 1 Drawing Sheet

DEVICE FOR GENERATING A PERIODIC CLOCK SIGNAL

CROSS-REFERENCE TO RELATED APPLICATIONS

This Utility Patent Application claims priority to German Patent Application No. DE 10 2006 050 375.9 filed on Oct. 25, 2006, which is incorporated herein by reference.

BACKGROUND

The present invention relates to a device and a method for generating a clock signal.

Conventionally, information is transmitted from a sender (a signal source) across a channel to a receiver at a different location, whereby analogues and digital data is transferred. Therefore, the signal source varies a physical parameter (in particular the electric voltage or the frequency of electromagnetic waves) and the receiver measures this parameter. The wanted signal delivered by the signal source is always superimposed by unwanted noise, since thermal noise occurs in all electronic circuits due to the thermal movement of charge carriers.

Bandpass filters are being utilized in order to suppress the noise and in order to achieve a very good signal/noise ratio. A bandpass filter is introduced into the signal channel in order to let pass frequency component within a frequency band having a bandwidth B=f2−f1 and in order to block or substantially attenuate the remaining frequency components. F1 is the lower limiting frequency and f2 is the upper limiting frequency. F0 is the medium frequency or resonant frequency of the bandpass filter. The wanted analogues or digital signal without noise includes only frequency components within the bandwidth of the bandpass filter. The carrier frequency of the transmitted signal corresponds to the medium frequency of the filter.

Quite often the problem occurs that a periodic clock signal must be generated for a given transmission channel, wherein the frequency of the clock signal is correlated with the carrier frequency of the wanted signal. In particular, this is necessary if a time dependent processing of the received signal must be performed, for example for automatic gain control. The clock recovery in digital transmission technology has the goal of determining the transmission clock of the sender from the received digital signal and thereby making it possible to sample the received signal exactly. The receiver must perform the clock recovery in order to determine the periodic sampling points in time of the data stream. It is impossible to analyse the received digital signal correctly without knowledge of the exact time alignment of the signal.

Conventionally phase looked loops are used for clock recovery purposes. They include a phase detector and a voltage controlled oscillator. The oscillator generates the clock signal depending on the output voltage of the phase detector. These circuits have the disadvantage that they are sensitive to temperature and process variations. Consequently, the recovered clock may not be correlated to the transmitted signal anymore.

For these and other reasons, there is a need for the present invention.

SUMMARY

One embodiment provides a device for generating a periodic clock signal including a bandpass filter. In one embodiment, the bandpass filter includes a bandpass filter input for receiving an input signal and a bandpass filter output for outputting a bandpass filter signal. The device includes further a comparator. A comparator has at least one comparator input receiving the bandpass filtered signal and a comparator output for outputting the clock signal. The comparator is adapted to output a first signal level at the comparator output, if the bandpass filtered signal exceeds a reference level. A zero crossing of the bandpass filtered signal may be used as reference level. A second signal level is output at the comparator output if the bandpass filter signal falls below the reference level. The output signal of the comparator is the clock signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
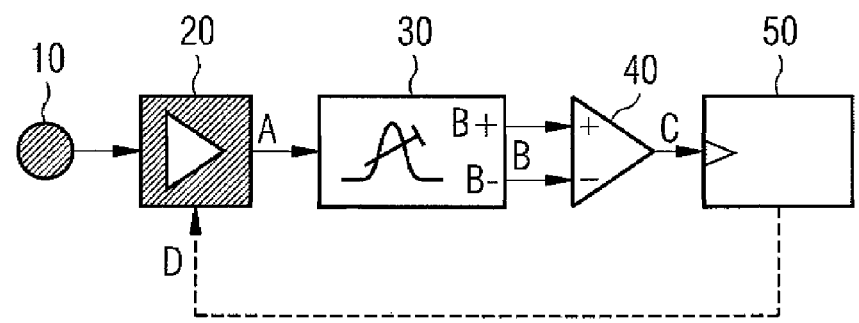
FIG. 1 illustrates a schematic depiction of the device for generating a periodic clock signal according to the one embodiment of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the present invention provides a method and device for generating a periodic clock signal, which provide a synchronized clock signal—in particular a clock signal independent of temperature and process variations.

In one embodiment, the device for generating a periodic clock signal includes a bandpass filter. A bandpass filter includes a bandpass filter input for receiving an input signal and a bandpass filter output for outputting a bandpass filtered signal. The device may further include a comparator. The comparator has at least a first comparator input for receiving the bandpass filtered signals and a comparator output for outputting the clock signals. The comparator is adapted to output a first signal level at the comparator output if the bandpass filtered signal exceeds a reference level. In particular, a zero crossing of the bandpass filtered signal may be regarded as reference levels. A second signal level is output at the comparator output if the bandpass filtered signal falls below the reference level. The output signal of the comparator is the clock signal.

The clock signal is periodic, because the zero crossings of the bandpass filtered white noise signals are displaced in a fixed interval with respect to each other. The input signal necessarily includes a noise component. The frequency of the output clock signal is correlated with the resonant frequency f0 of the bandpass filter. The device is independent of process and temperature fluctuations, since no electronic oscillator is utilized which is sensitive to such fluctuations. As long as the bandpass filter is conveniently adapted to data transfer, further modifications of the device are not necessary. The resulting clock signal adapts itself automatically to the changed bandpass filter. Furthermore, the device is failsafe, since the clock is only switched up or down at the zero crossing of the input signals. The implementation of the device may be very simple. Few components are needed. Therefore, the device may be implemented cost-efficiently.

The comparator may include a second comparator input for receiving the reference level. This implementation is especially simple. The accuracy of the comparator depends in this case on the exact input of the reference level.

It is preferred to use a comparator having a second comparator input. An inverted signal is received at the second comparator input, the signal being inverted with respect to the bandpass filtered signal. The bandpass filtered signal may be inverted using an external inverter or the bandpass filter may be adapted to output two complementary analogues signals. A zero crossing of the bandpass filtered signal may be detected by comparing the inverted signals to each other, since the inverted signals are only equal if they are both equal to zero. According to this embodiment, the comparator is adapted to recognize an over- or undershooting of the reference level by means of comparing the bandpass filtered signal with the inverted bandpass filter signal.

A pre-amplifier is provided, which includes a pre-amplifier input for receiving the input signal and a pre-amplifier output for outputting a pre-amplified input signal. According to this embodiment, the pre-amplifier output is connected to the bandpass filter input. The pre-amplifier is used for amplifying the transmitted signal. Due to the pre-amplifier, additional noise signals are added to the input of the comparator. However, these noise signals are for recovering the clock. The noise signal may be used for generating a clock signal, even if no wanted signal is transmitted.

The bandpass filter has the following transfer function A(s):

$$A(s) = \frac{k\omega_0^2}{s^2 + 2\delta s + \omega_0^2}.$$

$\omega_0$ is the resonant frequency, $\delta$ is the attenuation and k is the gain factor of the bandpass filter. Furthermore, the following holds: $s=i\omega$ and $i^2=-1$, wherein $\omega$ is the angular frequency of a harmonic input signal. The resulting clock frequency of the output signal may be calculated exactly, if the above transfer function for the bandpass filter is known. In this case, the clock frequency is equal to $$\frac{1}{2\pi}\sqrt{\omega_0^2 - \delta^2}$$

One embodiment of the device for generating a clock signal is schematically illustrated in FIG. 1. The device includes a signal source 10, which provides an output signal. The output signal of the signal source represents a superimposition of the wanted signal and noise caused by the system. The output signal of the signal source is amplified by a pre-amplifier 20 and a pre-amplified signal A is output to a bandpass filter 30.

Figure 2:
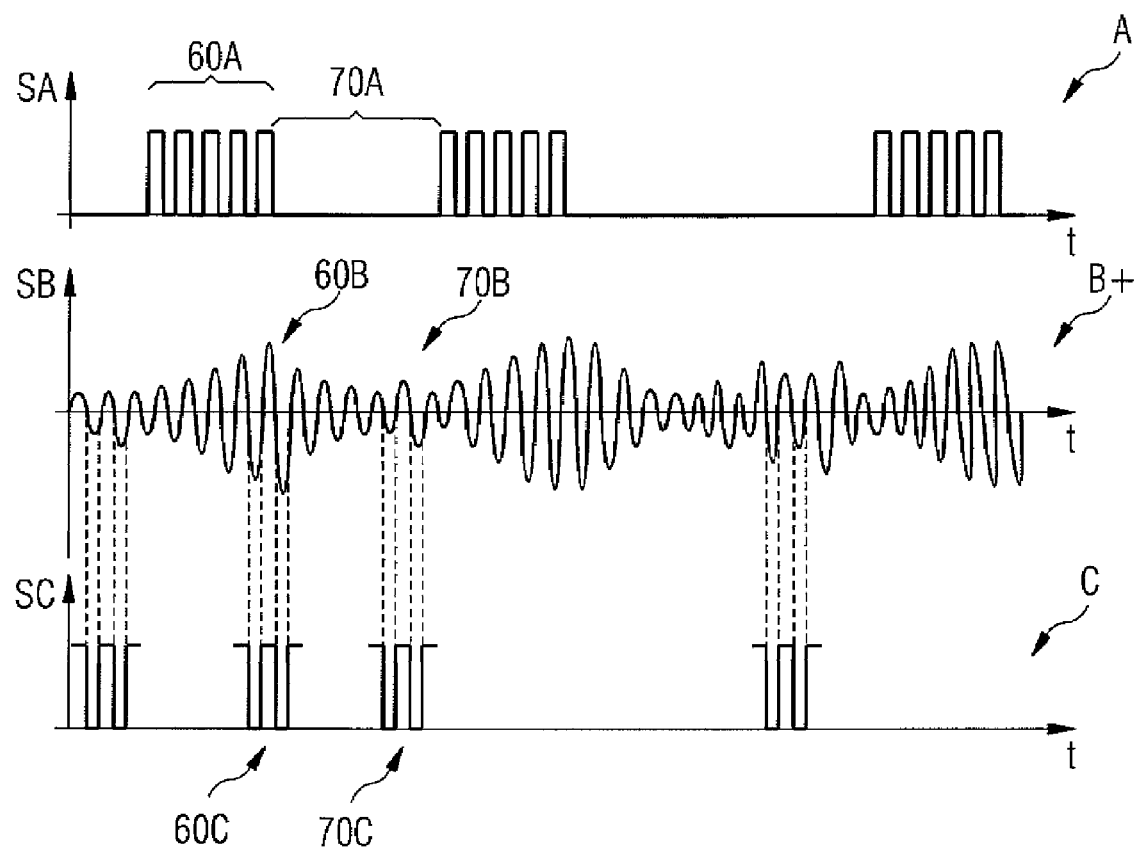
FIG. 2 illustrates the graphs of the input signals and output signals of the bandpass filter within a Cartesian coordinate system and a graph of the output signal of the comparator.

The top graph in FIG. 2 illustrates an example of a pre-amplified signal. The signal amplitude SA of the pre-amplified signal 1 is illustrated in relation to a time axis t within a cartesian coordinate system. The pre-amplified signal has phases 60A, during which a wanted signal is output. During the phases 70A only white noise is transmitted by the pre-amplifier. Due to the high signal/noise ratio the noise is not illustrated in FIG. 2.

The bandpass filter 30 in FIG. 1 filters the pre-amplified signal A and outputs two signals B+ and B−. B+ represents the bandpass filtered signal, whereas B− represents the inverted bandpass filtered signal. Consequently, the amplitude of signal B+ is only positive, if the amplitude of signal B− is negative and vice versa. Both signals B+ and B− are only equal to each other, if their amplitude is equal to zero.

The second graph illustrated in FIG. 2 represents an amplitude SB of the bandpass filtered signal B+next to a time axis t. The time axis t of signals A and B illustrated one below the other are identical. Consequently, the signals illustrated one below the other may be compared with each other. The phase 60A of the pre-amplified signal A corresponds to a phase 60B of the bandpass filtered signal B+. The bandpass filtered signal reaches the output of the bandpass filter 30 within a slight delay. This explains the time delay between phase 60A and 60B. Phase 70A of the pre-amplified signal A corresponds to a phase 70B of the bandpass filtered signals. Due to the inherent noise of the output signal of the pre-amplifier a signal is generated at the output of the bandpass filter B+.

A comparator 40 in FIG. 1 receives both the bandpass filtered signal B+ and the inverted bandpass filtered signal B−. The comparator compares the signal B+ to the inverted signal B−. If the signal B+ is stronger than the signal B−, then the comparator outputs a positive voltage signal C. If however signal B+ is smaller than the inverted signal B−, then the comparator outputs a negative output signal. As soon as signal B+ and the inverted signal B− are equal, the output signal of the comparator changes.

The bottom graph illustrated in FIG. 2 represents schematically the output signal C of the comparator 40. The amplitude SC of the signal C is illustrated in relation to a time axis t, which corresponds to the time axis of the graphs of signals A and B+ illustrated above. The output signal C is a periodic clock signal. Only portions of the periodic clock signal are illustrated in FIG. 2. Whenever the bandpass filtered signal B+ becomes equal to zero, the voltage of the output clock signal changes. The output signal is periodic, since it may be proven that the zero crossing of the bandpass filtered signals B+ must be periodic. This shall be explained in detail below.

The phase 60A of the pre-amplified signal A corresponds to a phase 60C of the clock signal C. The phase 70A of the pre-amplified signal A corresponds to the phase 70C of the clock signal. Although no wanted signal is transferred during phase 70C, a clock signal may be generated using the transferred noise.

Finally, the device includes a digital logic circuit 50, which may include in particular a digital/analogues converter. A digital logic circuit uses in particular the clock signal 50 in order to sample the information encoded in the transferred signal and in order to process this information. Furthermore, a feedback from the digital logic circuit to the pre-amplifier is illustrated in FIG. 1. The digital logic circuit may perform data processing using the clock signal, in particular the gain may be reduced after n filter oscillations. The control signal responsible for this may be generated using a digital/analogues converter, which is integrated in the digital circuit 50. The digital logic circuit may also be used for controlling a gain factor of the pre-amplifier 20 such that a clock signal may always be generated without increasing the signal/noise ratio unnecessarily. Therefore, the feedback control of the pre-amplifier is useful.

Subsequently, it shall be explained, why the zero crossings of the bandpass filtered output signals B+ are periodic. A bandpass filter capable of resonating may be represented by the following transfer function.

$$A(s) = \frac{k\omega_0^2}{s^2 + 2\delta s + \omega_0^2}.$$

$\omega_0$ is the resonance frequency, $\delta$ is the attenuation and k a gain factor for providing the wanted gain. S is equal to $s=i\omega$, wherein $i^2=-1$ and $\omega$ represents the angular frequency.

If a unit pulse (that is a pulse having an energy equal to one, wherein the area under the pulse is equal to one, such as a Dirac-pulse) the input to the bandpass filter, then the following output function is generated:

$$\frac{k\omega_0^2}{\sqrt{\omega_0^2 - \delta^2}} e^{-\delta t} \sin\left(\sqrt{\omega_0^2 - \delta^2}\, t\right)$$

This leads to an attenuated oscillation having the attenuation factor $\delta$ and the oscillation frequency $$\frac{1}{2\pi} \sqrt{\omega_0^2 - \delta^2}$$

The gain factor k of the filter is a linear factor within the pulse response just as a possible emphasis of the unit pulse at the input is a linear function of the pulse response.

If white noise is input to such a bandpass filter, then this white noise may be represented as an infinite long and dense sequence of weighted input pulses, which are distributed in time. This assumption conforms with the noise spectrum, since white noise has a constant power density spectrum, which is infinitely extended. This also applies to the sum of an infinite amount of differently weighted unit pulses. The weighting of the energy distribution of the noise unit pulses is in general represented by a Gaussian distribution. However this does not have a qualitative impact on the power density spectrum of the noise.

The noise response of a bandpass filter may be represented in the time domain by the following formula:

$$p(t) = \frac{\omega_0^2}{\sqrt{\omega_0^2 - \delta^2}} \sum_{i=0}^{\infty} \sigma(t - t_i) gw(i) e^{-\delta(t - t_i)} \sin\left(\sqrt{\omega_0^2 - \delta^2}\,(t - t_i)\right)$$

The constant system parameters $\omega_0$ and $\delta$ may be moved in front of the summation sign. $\sigma(t-t_i)$ represents the unit process function, wherein the process occurs at the point in time $t_i$ and gw (i) is the Gaussian distribution of the weighting factors of the noise pulses at the input.

Now, the frequency of the zero crossings of the signals p(t) shall be determined. The weighting factors gw (i) effect only the amplitude of the signals and have apparently no influence on the frequency of the zero crossings.

The exponential function $e^{-\delta(t-t_i)}$ may be represented as the sum of sinus function using mathematical transformations. Therefore, the sinus functions p(t) are left over, which may be represented as an infinite sum of $$\sin(\sqrt{\omega_0^2 - \delta^2}(t-t_i))$$

wherein the points in time $t_i$ are equally distributed. By use of the summation theorem for harmonic functions $$\sin(\alpha+\beta)=\sin(\alpha)\cos(\beta)+\cos(\alpha)\sin(\beta)$$

it can be proven that the linear superimposition of an infinite amount of sinusoidal oscillations as illustrated above lead to an oscillation having the following frequency $$\frac{1}{2\pi} \sqrt{\omega_0^2 - \delta^2}$$

even if the amplitude is statistically distributed. By introducing the quality factor Q, the following output frequency of the comparator is generated:

$$f_{CLK} = f_0 \sqrt{1 - \frac{1}{4Q^2}}.$$

If the resonance frequency f0 of the filter is changed, then the clock frequency fclk automatically changes without having to readjust other system parameters. The device is furthermore failsafe, because the generated signal clock only changes during the zero crossings of the bandpass filter signals. Consequently, potential high sensitive analogues systems are not disturbed.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for generating a periodic clock signal, comprising:
    a bandpass filter, the bandpass filter comprising a bandpass filter input for receiving an input signal and a bandpass filter output for outputting a bandpass filtered signal; and a comparator, the comparator having at least a first comparator input for receiving the bandpass filtered signal and a comparator output for outputting the clock signal, wherein the comparator is configured to output a first signal level at the comparator output, if the bandpass filtered signal exceeds a reference level, and output a second signal level at the comparator output, if the bandpass filtered signal falls below the reference level, wherein the comparator comprises a second comparator input, the second comparator input receiving a signal inverted with respect to the bandpass filtered signal, and the comparator being configured to detect an overshooting or undershooting of the reference level by means of the comparison between the bandpass filtered signal and the inverted bandpass filtered signal.

2. The device according to claim 1, wherein the comparator is configured to utilize a signal level equal to zero as reference level.

3. The device according to claim 1, comprising a pre-amplifier, the pre-amplifier having a pre-amplifier input for receiving the input signal and a pre-amplifier output for outputting a pre-amplified input signal, wherein the pre-amplifier output is connected to the bandpass filter input.

4. The device according to claim 1, wherein the bandpass filter is capable of resonating and has a transfer function A(s), which is defined by:

$$A(s) = \frac{k\omega_0^2}{s^2 + 2\delta s + \omega_0^2}$$

wherein $\omega_0$ is a resonant frequency, $\delta$ is an attenuation and k a gain factor of the bandpass filter, $s=i\omega$, $i^2=-1$, and $\omega$ represents the angular frequency.

5. A method for generating a periodic clock signal, the method composing:
receiving an input signal;
filtering the input signal using a bandpass filter in order to output a bandpass filtered signal;
comparing the bandpass filtered signal with a reference level;
generating a first signal level of the clock signal, if the bandpass filtered signal exceeds the reference level, and generating a second signal level of the clock signal, if the bandpass filtered signal falls below the reference level;
receiving a second signal inverted with respect to the bandpass filtered signal:
comparing the bandpass filtered signal with a inverted bandpass filtered signal: and
detecting an overshooting or undershooting of the reference level.

6. The method according to claim 5, wherein the reference level is a signal level equal to zero.

7. The method according to claim 6, comprising:
amplifying the input signal using a pre-amplifier; and
outputting the pre-amplified input signal to the bandpass filter for filtering.

8. The method according to claim 7, wherein a bandpass filter is used for filtering, which is capable resonating and has a transfer function A(s), which is defined by:

$$A(s) = \frac{k\omega_0^2}{s^2 + 2\delta s + \omega_0^2}$$

wherein $\omega_0$ is the resonance frequency, $\delta$ an attenuation, k a gain factor of the bandpass filter, $s=i\omega$, $i^2=-1$, and $\omega$ represents an angular frequency.

9. The method according to claim 5, comprising:
amplifying the input signal using a pre-amplifier; and
outputting the pre-amplified input signal to the bandpass filter for filtering.

10. The method according to claim 5, wherein a bandpass filter is used for filtering, which is capable resonating and has a transfer function A(s), which is defined by:

$$A(s) = \frac{k\omega_0^2}{s^2 + 2\delta s + \omega_0^2}$$

wherein $\omega_0$ is the resonance frequency, $\delta$ an attenuation, k a gain factor of the bandpass filter, $s=i\omega$, $i^2=-1$, and $\omega$ represents an angular frequency.

11. A device for generating a periodic clock signal, comprising:
a bandpass filter outputting a bandpass filtered signal; and
a comparator receiving the bandpass filtered signal and outputting the clock signal, wherein the comparator is configured to output a first signal level, if the bandpass filtered signal exceeds a reference level, and output a second signal level, if the bandpass filtered signal falls below the reference level, wherein the comparator comprises an input for receiving the reference level, and wherein the comparator comprises a second comparator input, the second comparator input receiving a signal inverted with respect to the bandpass filler signal, and the comparator being configured to detect an overshooting or undershooting of the reference level by means of the comparison between the bandpass filtered signal and the inverted bandpass filtered signal.

12. The device according to claim 11, wherein the comparator is configured to utilize a signal level equal to zero as reference level.

13. The device according to claim 11, comprising a pre-amplifier, the pre-amplifier having a pre-amplifier input for receiving the input signal and a pre-amplifier output for outputting a pre-amplified input signal, wherein the pre-amplifier output is connected to the bandpass filter input.

14. The device according to claim 11, wherein the bandpass filter is capable of resonating and has a transfer function A(s), which is defined by:

$$A(s) = \frac{k\omega_0^2}{s^2 + 2\delta s + \omega_0^2}$$

wherein $\omega_0$ is a resonant frequency, $\delta$ is an attenuation and k a gain factor of the bandpass filter, $s=i\omega$, $i^2=-1$, and $\omega$ represents the angular frequency.

15. A device for generating a periodic clock signal, comprising:
a bandpass filter outputting a bandpass filtered signal; and
comparator means for receiving the bandpass filtered signal, a signal inverted with respect to the bandpass filtered signal, and outputting the clock signal, wherein the comparator means is configured to output a first signal level, if the bandpass filtered signal exceeds a reference level, and output a second signal level, if the bandpass filtered signal falls below the reference level.

16. The device according to claim 15, wherein the comparator means is configured to utilize a signal level equal to zero as reference level.

17. A device, comprising:
bandpass filter outputting a bandpass filtered signal; and
a comparator receiving the bandpass filtered signal,
wherein the comparator is configured to output a first signal level, if the bandpass filtered signal exceeds a reference level, and to output a second signal level, if the bandpass filtered signal falls below the reference level, the comparator being configured to detect an overshooting or undershooting of the reference level by comparing the bandpass filtered signal and the inverted bandpass filtered signal.

\* \* \* \* \*